United States Patent [19]

Vasquez et al.

[11] Patent Number: 5,602,491
[45] Date of Patent: Feb. 11, 1997

[54] INTEGRATED CIRCUIT TESTING BOARD HAVING CONSTRAINED THERMAL EXPANSION CHARACTERISTICS

[75] Inventors: Barbara Vasquez, Austin, Tex.; John W. Stafford, Phoenix; William M. Williams, Gilbert, both of Ariz.

[73] Assignee: Motorola, Inc., Schaumburg, Ill.

[21] Appl. No.: 405,317

[22] Filed: Mar. 16, 1995

[51] Int. Cl.$^6$ .................................................. G01R 31/02
[52] U.S. Cl. ........................................ 324/760; 324/758
[58] Field of Search .............................. 324/760, 158.1, 324/754, 757, 758; 428/209; 361/728, 748

[56] References Cited

U.S. PATENT DOCUMENTS

| | | | |
|---|---|---|---|
| 4,866,507 | 9/1989 | Jacobs et al. | 361/748 |
| 4,943,468 | 7/1990 | Gordon et al. | 361/748 |
| 5,010,389 | 4/1991 | Gansauge et al. | 257/737 |
| 5,195,021 | 3/1993 | Ozmat et al. | 361/748 |
| 5,214,566 | 5/1993 | Dupre et al. | 361/748 |
| 5,435,057 | 7/1995 | Bindra et al. | 29/846 |

Primary Examiner—Ernest F. Karlsen
Attorney, Agent, or Firm—Bruce T. Neel

[57] ABSTRACT

A board (10) for testing an integrated circuit disposed on a semiconductor wafer. The board contains a plurality of substantially parallel signal layers (14) and power planes (16) that are supported and electrically isolated by a dielectric material (12). One or more constraint layers (18,20) are disposed in the dielectric material, and the constraint layers have a coefficient of thermal expansion of about 1–6 ppm/°C. In a preferred embodiment, the dielectric material is a fluoropolymer with a ceramic or silica filler, and the constraint layers are an iron-nickel alloy of about 30–40 percent nickel by weight. The board has thermal expansion characteristics substantially similar to silicon to ensure good contact to a silicon wafer during burn-in testing.

39 Claims, 1 Drawing Sheet

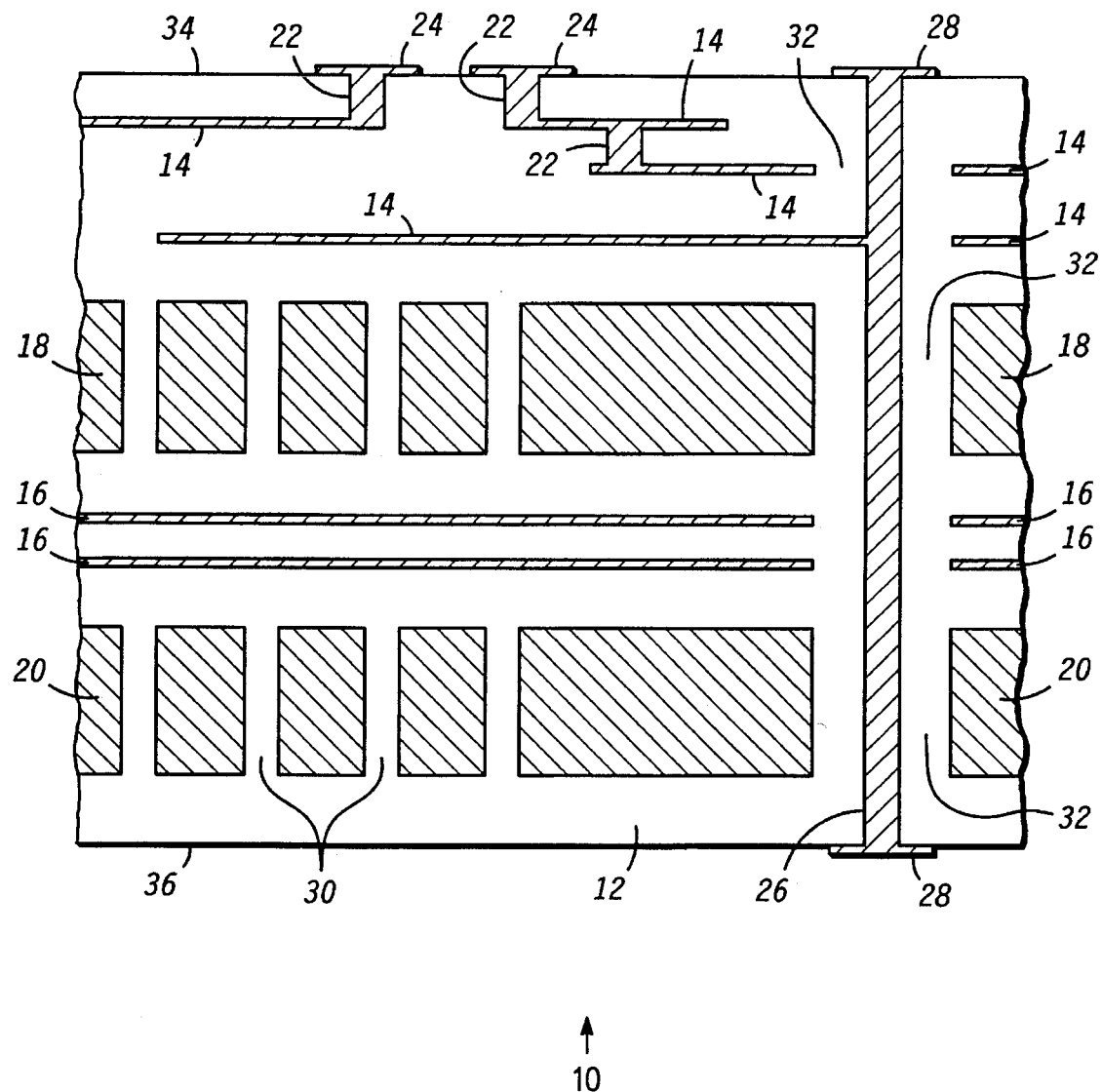

INTEGRATED CIRCUIT TESTING BOARD HAVING CONSTRAINED THERMAL EXPANSION CHARACTERISTICS

BACKGROUND OF THE INVENTION

The present invention relates, in general, to high or low-temperature, including burn-in, testing of integrated circuits (ICs) using a testing board having thermal characteristics similar to that of a semiconductor wafer used to fabricate the ICs.

After their manufacture, ICs are subjected to various types of testing to verify their reliability and operability. This testing may include exposure and functional testing of the IC to either, or both, high or low temperatures. One of these types of testing done at a high temperature is known as "burn-in testing" and involves the application of an electrical bias or other signals to the IC during an elevated-temperature baking period. The purpose of such burn-in testing is to accelerate the appearance of any latent defects which might otherwise only show up after many hours of IC use. In the past, burn-in testing often has been performed on ICs that have already been placed into a final package. However, the trend in burn-in testing is to perform such testing at the semiconductor wafer level. This can be done by either testing of IC die prior to their separation from a processed wafer or testing of individual IC die after separation from the wafer, but prior to packaging. One advantage of testing at the wafer level is a reduction in the cost of the testing due to the elimination of interposers or other intermediate contact assemblies that have been required in the past to connect a burn-in testing circuit to the ICs on the wafer. Another advantage of wafer level testing is the ability to more quickly provide feedback to the wafer fabrication line based on the results of functional and burn-in testing at the end of the line.

It is generally desirable that burn-in testing be performed at higher temperatures, for example about 150° C. This is so because such testing can be performed in a shorter time period than at lower temperatures. One of the requirements of a suitable testing board is that it be formed of a material that is stable at these higher temperatures. One such material is a silica or ceramic-filled fluoropolymer such as teflon. This material has a fairly low dielectric constant and is stable at temperatures up to 200° C. However, one problem with such a fluoropolymer material is that it has a coefficient of thermal expansion (CTE) of about 17 ppm/°C., which is significantly greater than the CTE of silicon, which is about 3 ppm/°C. Thus, it is difficult to ensure alignment and good contact between the testing board and the input/output pads on each of the ICs across the full surface of the wafer as the testing board and wafer thermally expand and contract. The use of silicon as a testing board material might avoid the disadvantages of the mismatch in CTEs discussed above, but a silicon testing board is more expensive to build than, and is not available in the large area formats commonly available for, a fluoropolymer board.

Testing boards are also used to perform cold, or low, temperature testing of ICs. As for burn-in testing above, it is desirable to avoid a mismatch in CTEs when performing cold testing. A mismatch in CTEs can result in poor contact with the IC under test.

Another problem faced by prior wafer-level testing boards is the difficulty in achieving good planarity of the surface of the board used to contact the semiconductor wafer. Because it is desirable for a hot/cold temperature testing board to make contact to a large number of integrated circuits on the wafer, it is important to provide a testing board that remains substantially planar during the varying temperatures used during testing. If good planarity is not achieved, then many ICs on the wafer will not be properly tested due to poor electrical connections with the contacts on the testing board.

Accordingly, there is a need for a hot or cold temperature/functional testing board having thermal expansion characteristics substantially similar to that of the semiconductor wafer containing a plurality of ICs to be tested. Also, it is preferable that such a testing board be less expensive to manufacture than a testing board made primarily from silicon. Further, it is desirable that such a testing board have a surface for contacting the ICs that is substantially planar.

BRIEF DESCRIPTION OF THE DRAWING

The sole figure illustrates a cross-section of a testing board having a constraint layer therein according to the present invention.

DETAILED DESCRIPTION OF THE DRAWING

Briefly stated, one embodiment of the present invention provides a board for functional or hot/cold testing of an integrated circuit disposed on a semiconductor wafer or on a singulated die. The board contains a plurality of substantially parallel signal layers and power planes that are supported and electrically isolated by a dielectric material. One or more constraint layers are disposed in the dielectric material, and the constraint layers have a substantially low CTE relative to the dielectric material, for example about 1–6 ppm/°C., to constrain the thermal expansion of the dielectric material. In a preferred embodiment, the dielectric material is a fluoropolymer with a ceramic or silica filler, and the constraint layers are an iron-nickel alloy of about 30–40 percent nickel by weight. The preferred board has thermal expansion characteristics substantially similar to silicon to ensure good and uniform contact to a silicon wafer during testing over a range of temperatures.

The present invention can be more fully described with reference to the sole figure, which illustrates a cross-section of a testing board 10 according to the present invention. A specific embodiment of the present invention is described below with reference to burn-in testing, but this is not intended to be limiting, and one of skill in the art will recognize that testing board 10 may also be used in low-temperature testing and/or other functional testing.

Testing board 10 has a plurality of substantially parallel signal layers 14 and power supply planes 16 that are supported and electrically isolated by a dielectric material 12. A constraint layer 18 and a constraint layer 20 are disposed substantially parallel to, and above and below, power supply planes 16. Constraint layers 18 and 20 are electrically isolated from signal layers 14 and power supply planes 16. As is well-known, signal layers 14 may be connected by vias 22, and contacts 24, which are electrically connected to certain of signal layers 14, are provided to electrically contact input/output pads located on an integrated circuit (not shown) to be tested. Typically, contacts 24 will make electrical contact to a large number of integrated circuits that are disposed on a semiconductor wafer. As is also well-known, a through-hole via 26 maybe formed through testing board 10 to provide through-hole contacts 28.

Generally, in the preferred embodiment, constraint layers 18 and 20 extend horizontally throughout the full extent of testing board 10, but have grill holes 30 disposed therein in several locations to improve the bonding between dielectric material 12 and constraint layers 18 and 20. Of course, constraint layers 18 and 20, along with signal layers 14 and power supply planes 16, have openings 32 therein as appropriate for vertical features such as via 26. Typically, power supply planes 16 will also be disposed horizontally across substantially the full extent of testing board 10. On the other hand, signal layers 14 will be patterned to correspond to the particular integrated circuit being tested and electrical test desired.

When testing board 10 is used for high-temperature burnin testing of an integrated circuit, dielectric material 12 should be thermally stable at a temperature of about 150° C., and preferably up to a temperature of about 200° C. One suitable material for dielectric material 12 is a fluoropolymer, for example, teflon. In a preferred embodiment, dielectric material 12 includes a filler that comprises about 80% by weight of the dielectric material. Preferred fillers include a silica or ceramic material. One specific example of a suitable dielectric material is a fluoropolymer sold under the trade name of Rogers R02800 (a fused silica-filled polytetraethylene (PTE) composite) or Rogers R03003 (a fused ceramic-filled polytetraethylene (PTE) composite). Another preferred characteristic of dielectric material 12 is that it have a dielectric constant less than about 3.

When testing board 10 is used to perform burn-in testing of a semiconductor wafer having integrated circuits thereon, it is desirable that testing board 10 have thermal expansion and contraction characteristics that are substantially similar to that of the semiconductor wafer. A testing board having such similar properties is described as being coexpansive with the semiconductor wafer being tested. As an example, a silicon wafer has a CTE of about 3 ppm/°C., and a typical fluoropolymer dielectric material has a CTE of about 17 ppm/°C. Thus, a fluoropolymer dielectric material alone is not coexpansive with a silicon wafer. However, according to the present invention, the presence of constraint layers 18 and 20 within dielectric material 12 as illustrated in the sole figure results in a constraining of the thermal expansion and contraction characteristics of dielectric material 12 such that a top surface 34 of testing board 10 is substantially coexpansive with the semiconductor wafer being tested.

Generally, constraint layers 18 and 20 have a CTE that is substantially less than the CTE of dielectric material 12. This is so because the CTE of dielectric material 12 is typically much greater than that of the semiconductor wafer. In a preferred embodiment, the CTE of constraint layers 18 and 20 is between about 1–6 ppm/°C., and more preferably is less than about 3 ppm/°C.

One suitable material for forming constraint layers 18 and 20 is an iron-nickel alloy having a composition of about 30–40% nickel by weight. For example, such an alloy that consists essentially of iron and nickel has a CTE that ranges from about 8 ppm/°C. for a nickel composition of 30% to a minimum CTE of about 1 ppm/°C. at a nickel composition of about 35%. From this minimum, the CTE of this alloy increases to about 6 ppm/°C. at a nickel composition of about 40%. In most applications, it is believed that a nickel composition of about 35% is most preferred because of the minimum CTE achieved, but a nickel composition of about 30–40% is also suitable in some cases. A specific example of an iron-nickel alloy having the characteristics just described is an iron-nickel alloy sold under the tradename of INVAR, which comprises about 30–40% nickel by weight, about 0.4% manganese by weight, and about 0.1% carbon by weight. The balance of the INVAR alloy comprises iron, and the thermal conductivity of this alloy is about 0.25 W/cm-°C.

Other suitable materials for forming constraint layers 18 and 20 are tungsten, which has a CTE of 4 ppm/°C., or carbon fibers, which have a CTE of 2.3–2.8 ppm/°C. Also, a carbon fiber laminate could be used.

The thickness of constraint layers 18 and 20, either individually or combined, is not critical. However, in a preferred embodiment constraint layers 18 and 20 have a combined thickness that is about 50% of the total thickness of testing board 10. Although two constraint layers are illustrated in the sole figure, it is not necessary that exactly two constraint layers be used. In some cases, a single constraint layer may be used, and in such a case the preferred thickness of the single constraint layer is about 50% of the total thickness of testing board 10. Also, if a single constraint layer is to be used, it is preferably placed at a height of about 50% of the total thickness of testing board 10, where this total thickness is measured from a bottom surface 36 of testing board 10 to top surface 34. Where two or more constraint layers are to be used, it is preferred that at least one of the constraint layers be disposed at a height of about 50% of the total thickness of testing board 10.

As discussed above, power supply planes 16 and signal layers 14 are disposed in testing board 10. Preferably, constraint layers 18 and 20 are disposed over and below power supply planes 16, and signal layers 14 are disposed above the top-most constraint layer, all as shown in the figure. The vertical and horizontal spacing and thicknesses of signal layers 14 and power supply planes 16 may vary widely depending on the particular application at hand. As only one particular example, power supply planes 16 may each have a thickness of 0.025 millimeters with a vertical spacing of 0.5 millimeters, and signal layers 14 may have similar thicknesses and vertical spacings with a horizontal separation between signal layers 14 of about 0.05 millimeters.

Testing board 10 may be manufactured using techniques that are well-known in the art of forming printed wire boards. As is typical, signal layers 14, through-hole via 26, and power supply planes 16 may be formed of copper. As a specific example, a dielectric of teflon, two constraint layers of INVAR, and conductive layers of copper may be appropriately patterned and then bonded under a pressure of about 70–105 kg/cm$^2$ at a temperature of about 390° C. Such a lamination procedure is also known in the art. A testing board formed in this manner may have a total thickness of about 2.5 millimeters, and the two constraint layers may each have a thickness of 0.6 millimeters.

As mentioned previously, testing board 10 has top surface 34 for contacting a semiconductor wafer through contacts 24. One of the significant advantages of the present invention is that the planarity of top surface 34 has only a small variation across the full extent of testing board 10. Specifically, in a preferred embodiment using a fluoropolymer for dielectric material 12 and an iron-nickel alloy for constraint layers 18 and 20, the planarity of top surface 34 varies less than about 500 ppm across the full extent of testing board 10. The good planarity is achieved due to the use of constraint layers 18 and 20, which are themselves very flat and plane. In addition, contacts 24 may be fly-cut or lapped flat if additional flatness and planarity are desired.

The good planarity of testing board 10 is desirable to ensure good contact to a die to be tested when contact is first made at room temperature, and the good CTE match described above ensures that this good contact is maintained over the full temperature range of the test.

By now, it should be appreciated that there has been provided a novel board for functional and high/low temperature testing of an integrated circuit. This board has a CTE substantially similar to that of a semiconductor wafer, such as silicon, containing integrated circuits that are being subjected to burn-in testing. Thus, the testing board according to the present invention will remain substantially coexpansive with the semiconductor wafer during the full length of the test through both high and low temperatures. Also, the contacting surface of the testing board will remain substantially planar. A significant advantage is that good contact can be maintained during this testing even though the burn-in board and the semiconductor wafer both thermally expand and contract during testing. Another advantage is the ability to use an inexpensive dielectric material for the testing board that is stable for the more desirable high-temperature testing and has a CTE significantly greater than that of silicon. The use of a constraint layer according to the present invention significantly reduces the thermal expansion of such a fluoropolymer testing board. A still further advantage of the fluoropolymer testing board of the present invention is that it is less expensive to manufacture than a testing board using a dielectric material of ceramic or silicon.

Although testing board 10 has been described above with reference to wafer-level testing, one of skill in the art will recognize that testing board 10 may also be used for hot/cold temperature and functional testing of individual or singulated die prior to packaging or assembly of the die. Such die are held in place during testing using, for example, a mounting tray having a clip to securely hold each die. In addition, in other applications, testing board 10 could be used to perform testing of ICs, for example, in ceramic packages.

Moreover, although the semiconductor wafer to be tested is described above in one example as being silicon, one of skill in the art will recognize that testing board 10 may be appropriately modified to attain a good CTE match with other semiconductor wafers such as gallium arsenide or indium phosphide.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An integrated circuit testing board comprising:
   a plurality of conductive testing layers;
   a dielectric material surrounding and electrically isolating said plurality of conductive testing layers from one another, wherein said dielectric material has a first coefficient of thermal expansion; and
   a constraint layer disposed in said dielectric material wherein said constraint layer has a second coefficient of thermal expansion substantially less than said first coefficient of thermal expansion and wherein a surface of said testing board comprises contacts for touching an integrated circuit on a semiconductor material and said surface is substantially thermally coexpansive with said material.

2. The testing board of claim 1 wherein said second coefficient of thermal expansion is between about 1–6 ppm/°C.

3. The testing board of claim 1 wherein said second coefficient of thermal expansion is less than about 3 ppm/°C.

4. The testing board of claim 1 wherein said constraint layer is an iron-nickel alloy.

5. The testing board of claim 1 wherein said constraint layer is an alloy consisting essentially of iron and nickel.

6. The testing board of claim 5 wherein said plurality of conductive testing layers consist essentially of copper.

7. The testing board of claim 1 wherein said constraint layer comprises carbon fibers.

8. The testing board of claim 1 wherein said constraint layer comprises tungsten.

9. The testing board of claim 1 wherein said constraint layer comprises an iron-nickel alloy having about 30–40 percent nickel by weight.

10. The testing board of claim 9 wherein said iron-nickel alloy has a thermal conductivity of about 0.25 W/cm-°C.

11. The testing board of claim 1 wherein said constraint layer comprises about 35 percent nickel by weight.

12. The testing board of claim 1 wherein said constraint layer is an iron-nickel alloy comprising about 30–40 percent nickel by weight, about 0.4 percent manganese by weight, and about 0.1 percent carbon by weight.

13. The testing board of claim 1 wherein said constraint layer is an iron-nickel alloy sold under the name of INVAR.

14. The testing board of claim 1 wherein said wafer is a silicon wafer.

15. The testing board of claim 1 wherein said board has a coefficient of thermal expansion substantially similar to silicon.

16. The testing board of claim 1 wherein said dielectric material is thermally stable at a temperature greater than about 150° C.

17. The testing board of claim 1 wherein said dielectric material comprises a fluoropolymer.

18. The testing board of claim 17 wherein said dielectric material is thermally stable to a temperature of about 200° C.

19. The testing board of claim 18 wherein said dielectric material has a dielectric constant less than about 3.

20. The testing board of claim 17 wherein said dielectric material further includes a filler comprising a silica or ceramic.

21. The testing board of claim 20 wherein said filler comprises about 80 percent by weight of said dielectric material.

22. The testing board of claim 17 wherein said fluoropolymer is teflon.

23. The testing board of claim 1 wherein said dielectric material is a fluoropolymer sold under the tradename of Rogers RO2800 or Rogers RO3003.

24. The testing board of claim 1 wherein said board has a surface for contacting a semiconductor wafer and a planarity of said surface has a variation of less than about 500 ppm across a full extent of said testing board.

25. The testing board of claim 1 wherein said testing board has a total thickness and said constraint layer has a thickness of about 50 percent of said total thickness.

26. The testing board of claim 1 wherein said constraint layer is disposed at a height about 50 percent of a total thickness of said testing board as measured from a bottom surface of said dielectric material to a top surface of said dielectric material.

27. The testing board of claim 1 wherein said constraint layer and said dielectric material are bonded by pressing together at a pressure of about 70–105 kg/cm$^2$ at a temperature of about 390° C.

28. An electrical testing board, comprising:

a plurality of conductive layers disposed in a dielectric material wherein said plurality of conductive layers are substantially parallel and said dielectric material substantially surrounds and electrically isolates said plurality of conductive layers from one another; and a first constraint layer disposed in said dielectric material wherein said first constraint layer has a coefficient of thermal expansion of about 1–6 ppm/°C., said first constraint layer is substantially parallel to said plurality of conductive layers, and said first constraint layer is electrically isolated from said plurality of conductive layers by said dielectric material and wherein a surface of said testing board comprises contacts for touching an integrated circuit on a semiconductor material and said surface is substantially thermally coexpansive with said material.

29. The testing board of claim 28 wherein said plurality of conductive layers comprise signal layers or power supply planes.

30. The testing board of claim 29 wherein said first constraint layer has a plurality of grill holes to provide an improved bond between said dielectric material and said first constraint layer.

31. The testing board of claim 28 further comprising a second constraint layer disposed substantially parallel to and below said first constraint layer and wherein a power supply plane is disposed between said first constraint layer and said second constraint layer.

32. The testing board of claim 31 wherein said plurality of conductive layers comprises a signal layer and said signal layer is disposed above said first constraint layer.

33. A testing board for testing an integrated circuit, comprising:

a plurality of substantially parallel conductive testing layers;

a dielectric material disposed around and electrically isolating said testing layers from one another, wherein said dielectric material comprises a fluoropolymer and is substantially stable at a temperature greater than about 150° C.; and a constraint layer disposed in said dielectric material wherein said constraint layer has a coefficient of thermal expansion of about 1–6 ppm/°C. and wherein a surface of said testing board comprises contacts for touching an integrated circuit on a semiconductor material and said surface is substantially thermally coexpansive with said material.

34. The testing board of claim 33 wherein said constraint layer is an iron-nickel alloy having a nickel composition of about 30–40 percent by weight.

35. The testing board of claim 34 wherein said dielectric material further includes a filler comprising about 80 percent by weight of said dielectric material, wherein said filler is a silica or ceramic.

36. The testing board of claim 1 wherein said semiconductor material is a semiconductor wafer and said integrated circuit is one of a plurality of integrated circuits disposed on said semiconductor wafer.

37. The testing board of claim 36 wherein said testing board contacts each of said plurality of integrated circuits on said semiconductor wafer.

38. The testing board of claim 1 wherein said semiconductor material is a singulated die that has been separated from a plurality of integrated circuits formed on a semiconductor wafer and said integrated circuit is disposed on said singulated die.

39. The testing board of claim 1 wherein said integrated circuit is disposed in a ceramic package.

* * * * *